US009448263B2

(12) United States Patent
Lee et al.

(10) Patent No.: US 9,448,263 B2
(45) Date of Patent: Sep. 20, 2016

(54) POWER QUALITY MONITORING APPARATUS FOR RAILWAY POWER SYSTEM

(76) Inventors: Eun-Kyu Lee, Cheongju-Si (KR); Tae-Suk Kim, Cheongju-Si (KR); Kyoung-Min Kwon, Jeungpyeong-Gun (KR); Kyoung-Min Son, Cheongju-Si (KR); Se-Wan Pyo, Namyangju-Si (KR)

( * ) Notice: Subject to any disclaimer, the term of this patent is extended or adjusted under 35 U.S.C. 154(b) by 561 days.

(21) Appl. No.: 13/419,709

(22) Filed: Mar. 14, 2012

(65) Prior Publication Data
US 2013/0166232 A1 Jun. 27, 2013

(30) Foreign Application Priority Data

Dec. 26, 2011 (KR) .......................... 10-2011-0142831

(51) Int. Cl.
*G01R 21/00* (2006.01)
*G06F 15/00* (2006.01)
*H02J 13/00* (2006.01)

(52) U.S. Cl.
CPC .............. *G01R 21/00* (2013.01); *G06F 15/00* (2013.01); *H02J 13/0062* (2013.01); *Y02E 40/30* (2013.01)

(58) Field of Classification Search
USPC ...................................................... 702/60–65
See application file for complete search history.

(56) References Cited

U.S. PATENT DOCUMENTS

| 4,795,859 | A  | * | 1/1989  | Kato et al. .................... 191/4 |
| 6,493,644 | B1 | * | 12/2002 | Jonker et al. ................. 702/61 |
| 2005/0158061 | A1 | * | 7/2005  | Do ............................. 399/44 |
| 2010/0060212 | A1 | * | 3/2010  | Negoro et al. ............. 318/400.3 |
| 2011/0101989 | A1 | * | 5/2011  | Hyde et al. .................. 324/527 |
| 2013/0147441 | A1 | * | 6/2013  | Lee et al. ..................... 320/167 |

OTHER PUBLICATIONS

Texas Instruments, 1996, TMS320C32 Digital Signal Processor, Texas Instruments Incormporated, pp. 1-45.*
Dallas Semicondutor, no date, DS1232 MicroMonitor Chip, Dallas Semiconductor, pp. 1-7.*
Toshiba, 2002 Sep. 25, Toshiba Photocoupler GaAs Ired & Photo-Transistor, Toshiba, pp. 1-10.*

* cited by examiner

*Primary Examiner* — Mischita Henson

(57) ABSTRACT

A power quality monitoring apparatus is developed for a railway power system. The apparatus is calculating the energy flow and the power consumption and recording the by using the voltage and current sensors at AC and DC power source in the various industrial fields. The voltage and current phases are detected for the AC power. The direction of current is detected to calculate the power consumption for the DC power. Then, the detected data is analyzed. It is possible to monitor the variation of the voltages and current values of the railway vehicle in real time. It is possible to display the variations of the vehicle loads, the AC power output, the voltage and current value fluctuations, the power consumption and power flows in a form of the graphic or text format. Thereby, it is possible to easily understand the overall status of the overhead line's environment.

10 Claims, 15 Drawing Sheets

POWER QUALITY MONITORING APPARATUS FOR RAILWAY POWER SYSTEM

BACKGROUND OF THE INVENTION

1. Field of the Invention

The present invention relates to a power quality monitoring apparatus for a railway power system. More particularly, the power quality monitoring apparatus calculates the energy flow and the power consumption through the power voltage sensor and current sensor at the AC and DC power source. Then, the energy flow and the power consumption are recorded in the various industrial fields. The voltages and the current phases for the AC power, and the direction of current for the DC power are detected and recorded to calculate the power consumption, and the stored data is analyzed.

2. Related Prior Art

There is a huge difference between the Power lines for railway vehicles and the general lines for commercial such as the electric lines of the Korea Electric Power Corporation (KEPCO). The supplied power must be suitable to operate the motor of the railway vehicle, which is needed the heavy loads with large inertia.

Such a power line for railway vehicle is required a different power supply system comparing to the line of the KEPCO, since the railway vehicle requires instantly large amount of initial power. In addition, general KEPCO power is also supplied in smart grid and railway power system fields. Thus, power environments required in industries significantly change power environments provided by KEPCO. To install a facility or system at a load where a large amount of power is consumed to an extent that may vary the energy source, there is a need to perform a process for checking electrical environments or power flow states at the location before installing the facility or system.

Actual voltage of a DC overhead line in the case of a railway power system, in which normal substation voltage supplied from KEPKO to a 12-phase rectifier is 1620V, is reduced below 1580V in a powering mode of a train, in which a motor of the train consumes power, and is raised to 1800V in a regenerative braking mode of the train in which the motor of the train operates as an electricity generator. Here, current of up to hundreds of amperes flows.

There is a need to determine the capacity of the system installed at such an environment and to collect, record, and analyze power data during a certain period in order to analyze power quality. The same is true not only of the substation as a power source but also of the train as a load.

SUMMARY OF THE INVENTION

Therefore, the present invention has been made in view of the above problems, and it is an object of the present invention to provide a power quality monitoring apparatus for a railway power system, wherein energy flow and the amount of power are calculated and recorded using voltage and current sensors at AC and DC power source sides in various industrial fields, voltage and current phases are detected in the case of AC power, the direction of current is detected to calculate power consumption in the case of DC power, and stored data is analyzed.

In accordance with the present invention, the above and other objects can be accomplished by the provision of a power quality monitoring apparatus for a railway power system, the apparatus including a voltage detector and a current detector provided respectively at a power supply portion and a load portion to detect a voltage value and a current value, a signal input unit for receiving signals from the voltage and current detectors, a signal converter for converting an analog signal received from the signal input unit into a digital signal, a memory including a data storage unit for storing data received in real time and a data record unit for recording collected data, a display unit for displaying monitored data, and a controller for receiving current and voltage values detected by the power supply portion and the load portion in real time and monitoring changes in the detected current and voltage values, storing power flow and the amount of supplied power, and transmitting corresponding information to a remote location through a communication module.

Preferably, the controller includes an arithmetic unit including a TMS320c32-60 digital signal processor (DSP).

Preferably, the power quality monitoring apparatus further includes a TLP620-4 photocoupler for isolating input and output signals.

Preferably, the voltage detector is a DCPT 2516 voltage detector.

Preferably, the controller includes a TMS320C32 circuit and a power source monitoring circuit.

Preferably, the power source monitoring circuit includes a DS1232 unit and the DS1232 unit outputs a reset signal when power is equal to or less than 4.5V when a 3rd pin of the DS1232 unit has been connected to VCC and outputs a reset signal when power is equal to or less than 4.75V when the 3rd pin has been connected to GND.

Preferably, the controller has a watch dog function to monitor whether or not a CPU program is properly running by outputting a reset signal when no pulse is input to a 7th pin of the DS1232 unit, and the watch dog function outputs a reset signal if no pulse is input for 1.2 seconds when a 2nd pin of the DS1232 unit has been connected to VCC, outputs a reset signal if no pulse is input for 150 msec when the 2nd pin has been connected to GND, and outputs a reset signal if no pulse is input for 500 msec when the 2nd pin has been opened.

DETAILED DESCRIPTION OF THE PREFERRED EMBODIMENT

Embodiments of the present invention will now be described in detail with reference to the accompanying drawings.

Figure 1:
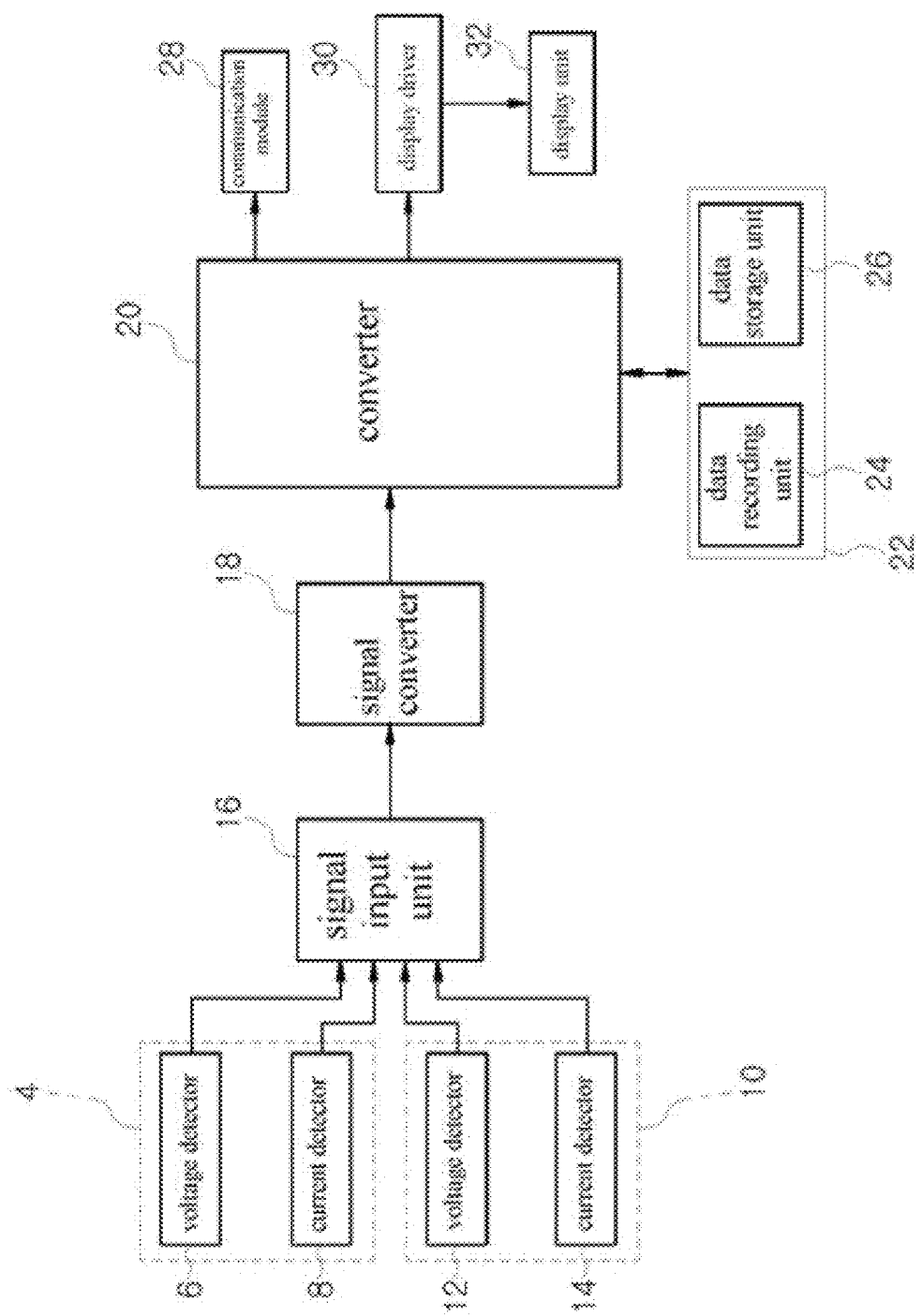
FIG. 1 is a block diagram of a power quality monitoring apparatus for a railway power system according to an embodiment of the present invention.
Figure 2:
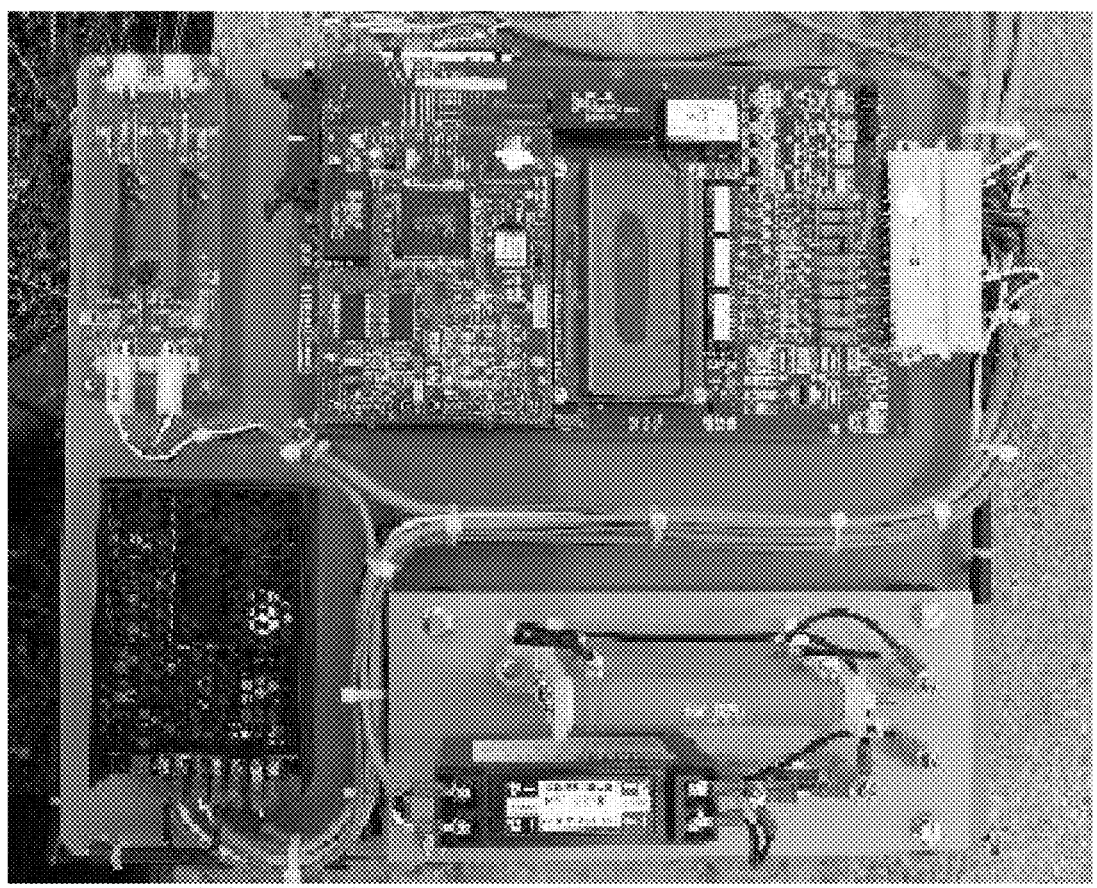
FIG. 2 shows a photograph of the power quality monitoring apparatus for the railway power system according to the embodiment of the present invention.

FIG. 1 is a block diagram of a power quality monitoring apparatus for a railway power system according to an embodiment of the present invention and FIG. 2 shows a photograph of the power quality monitoring apparatus for the railway power system according to the embodiment of the present invention.

As the power quality monitoring apparatus 2 for the railway power system according to an embodiment of the present invention, a monitoring device for collecting data in real time was manufactured and tested by WOOJIN INDUSTRIAL SYSTEMS CO., LTD. Here, TSM320c32 was used as a digital signal processor that performs main calculations and data values was collected at 5 ms sampling. Sampled data was recorded on a Compact Flash (CF) card and the recorded data was analyzed through a PC analysis program and is then output as graphical data.

Table 1 shows details of main components of the power quality monitoring apparatus 2 for the railway power system according to an embodiment of the present invention.

TABLE 1

| Main Components | Specification | Usage |
| --- | --- | --- |
| DSP | TMS320c32 - 60 Mhz | Arithmetic processing |
| Data Recording Memory | Compact Flash Memory 2 Giga Byte | Record collected data |

TABLE 1-continued

| Main Components | Specification | Usage |
| --- | --- | --- |
| LCD | Graphic LCD | Display current state |
| Data Storage Memory | DS1245Y | Store data in real time |
| A/D Converter | AD7891AS-1 | Analog to digital conversion |
| Photocoupler | TLP620-4 | Digital input signal isolation |
| Isolation Amp | AD202JY | Analog signal isolation input |
| Timer IC | DS12c887 | Timer IC |
| Power Source | DC100 V/5 V, +15 V, −15 V | Control power supply |
| DCPT | DCPT 2516 | Voltage sensor |
| DCCT/ACCT | KLL3.0K-10VD | Current sensor |

The power quality monitoring apparatus 2 for the railway power system according to an embodiment of the present invention includes voltage detectors 6 and 12 and current detectors 8 and 14, a signal input unit 16, a signal converter 18, a converter 20, a memory 22, a communication module 28, a display driver 30, and a display unit 32. The voltage detectors 6 and 12 and the current detectors 8 and 14 are provided in a power supply portion 4 and a load 10, respectively, to detect voltage and current levels. The signal input unit 16 receives signals from the voltage detectors 6 and 12 and the current detectors 8 and 14. The signal converter 18 converts analog signals received from the signal input unit 16 into digital signals. The memory 22 includes a data storage unit 26 that stores received data in real time and a data recording unit 24 that records collected data. The display unit 32 displays monitored data. The display driver 30 drives the display unit 32. The converter 20 receives detected current and voltage values in real time from the power supply portion 4 and the power quality monitoring apparatus 2, monitors changes in the detected current and voltage values, stores power flow and the amount of supplied power, and transmits corresponding information to a remote location through the communication module 28.

More specifically, the converter 20 includes an arithmetic unit of a TMS320c32-60 DSP, which is a digital signal processor that performs analog-to-digital conversion, card recording, and data operation and processing and is capable of 32-bit floating-point calculations and is suitable for precise data processing. Table 2 shows functionality and characteristics of the DSP.

TABLE 2

Functionality and Characteristics of DSP

| Categories | Functionality and Characteristics |
| --- | --- |
| Overview | 32-bit floating-point calculations<br>Modified Harvard Architecture (3 Internal buses and 1 external bus)<br>144-pin PQFP package<br>0.7 um triple-lever-metal CMOS semiconductor technology |
| Processing Speed | 3 models of 40/50/60 MHz according to clock frequency<br>2 clocks = 1 operation cycle<br>Processing speed of 30 MIPS, 60 MFLOPS, 330 MOPS at 60 MHz |
| Memory | Two 256 × 32-bit internal RAM block (with a total of 512 words)<br>Access to external memories for 16/32-bit program and 8/16/32-bit data<br>64 × 32-bit instruction cache<br>16M × 32 external expansion memory region 16M × 32 (24-bit addresses)<br>Different memories in microprocessor and microcomputer modes<br>4 boot program loader schemes in microcomputer mode (boot ROM 1, boot ROM 2, boot ROM 3, serial boot) |
| Instructions | 32-bit instructions, 8/16/32-bit data<br>2 or 3-operand instructions |

TABLE 2-continued

Functionality and Characteristics of DSP

| Categories | Functionality and Characteristics |
|---|---|
| | 2 instructions using ALU and multiplier are executed with single cycle |
| | Conditional branch, call, return instructions, and delay branch instructions |
| | Block iterative processing instructions |
| | Zero-overhead capable of single cycle branching |
| | Interlocked instruction for multi-processing |
| Internal | Eight 40/32-bit expansion precise register (with accumulator functionality) |
| Structure | Eight 32-bit subsidiary register |
| | 40/32-bit floating point and integer calculation ALU |
| | 40/32-bit floating point and integer calculation multiplier |
| | 32-bit barrel shifter |
| | Two address generator having subsidiary register and subsidiary register arithmetic unit |
| I/O | Include 2-channel DMA controller for simultaneously performing I/O and CPU operations |
| | Include two 32-bit timers |
| | Include 1 serial port capable of 8/16/24/32-bit transmission |
| | Use vector-type interrupt |

The display unit 32 and the display driver 30 are provided in a modular form. For example, the display unit 32 and the display driver 30 are designed as a graphic LCD module which generally includes an interface unit, a controller, a display unit, and a backlight unit. An LSI including a Character Generator (CG) ROM, a CG RAM, and a display data RAM, which correspond to main elements of the graphic LCD module, was first developed in Japan and thus the character CG ROM has a function to display Japanese characters.

Signal or power units for connecting the LCD module to the CPU include 14-pin terminals, where 15th and 16th pins are added to perform backlight functions.

TABLE 3

| Pin | Signal Name | Function |
|---|---|---|
| 1 | $V_{SS}$ | Power source, GND |
| 2 | $V_{DD}$ | Power source, +5 V |
| 3 | $V_{EE}$ | Contrast control voltage level (V - V = 1.5~0 V) |
| 4 | $R_S$ | Register Select (0 = instruction, 1 = data) |
| 5 | R/W⁻ | Read/Write (0: CPU → LCD, 1: CPU ← LCD) |
| 6 | E | Enable signal for read/write LCD |
| 7 | DB0(LSB) | Data bus |
| 8 | DB1 | |
| 9 | DB2 | |
| 10 | DB3 | |
| 11 | DB4 | |
| 12 | DB5 | |
| 13 | DB6 | |
| 14 | DB7(MSB) | |
| 15 | A | +LED (Power source for backlight LED, +4.4~4.7 V) |
| 16 | K | −LED (Power source for backlight LED, GND) |

Figure 3:
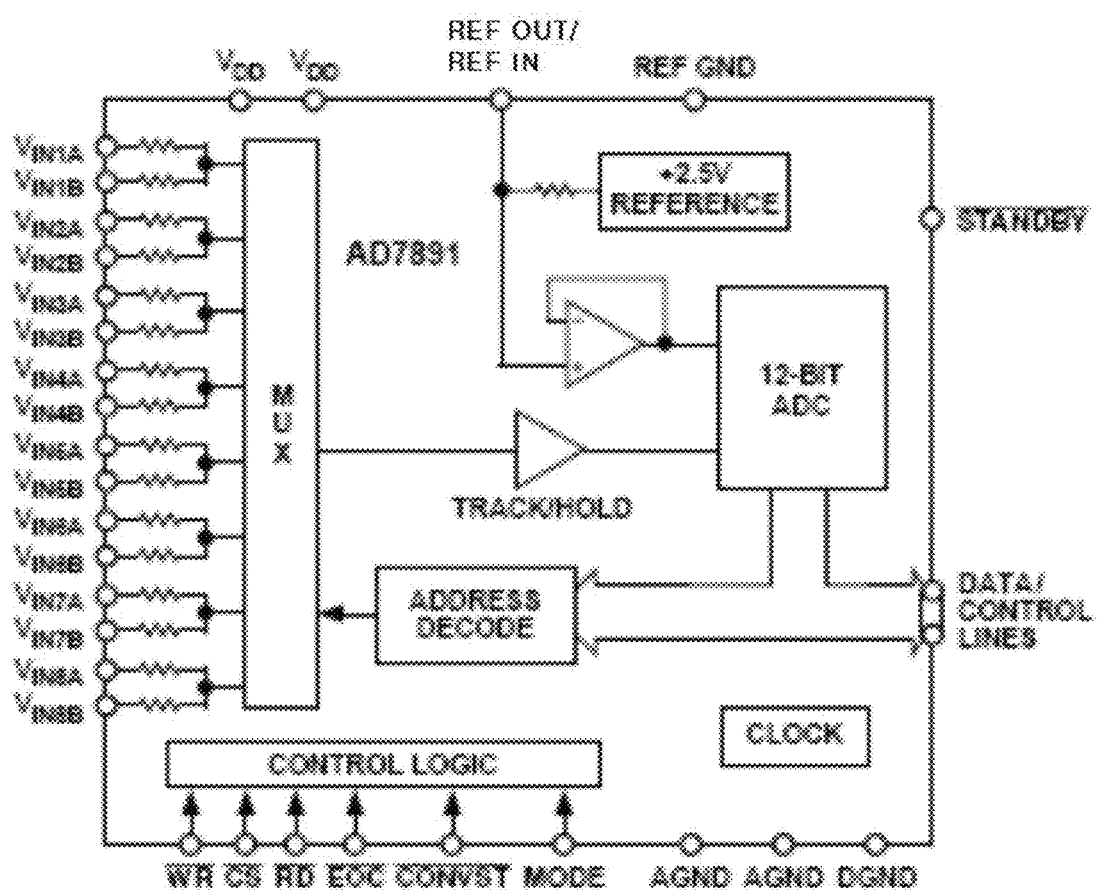
FIG. 3 is a circuit diagram of a signal converter according to an embodiment of the present invention.

The signal converter 18 uses an AD7891AS-1 A/D converter and is used to receive and convert analog signals such as current, voltage, or variable load signals into digital values. FIG. 3 is a circuit diagram of the signal converter 18. The following are characteristics of the AD7891AS-1 A/D converter.

Fast 12-Bit ADC with 1.6 ms Conversion Time
Eight Single-Ended Analog Input Channels
Overvoltage Protection on Each Channel
Selection of Input Ranges: ±5 V, ±10 V for AD7891-1
Parallel and Serial Interface
On-Chip Track/Hold Amplifier
On-Chip Reference
Single Supply, Low Power Operation (85 mW max)

Figure 4:
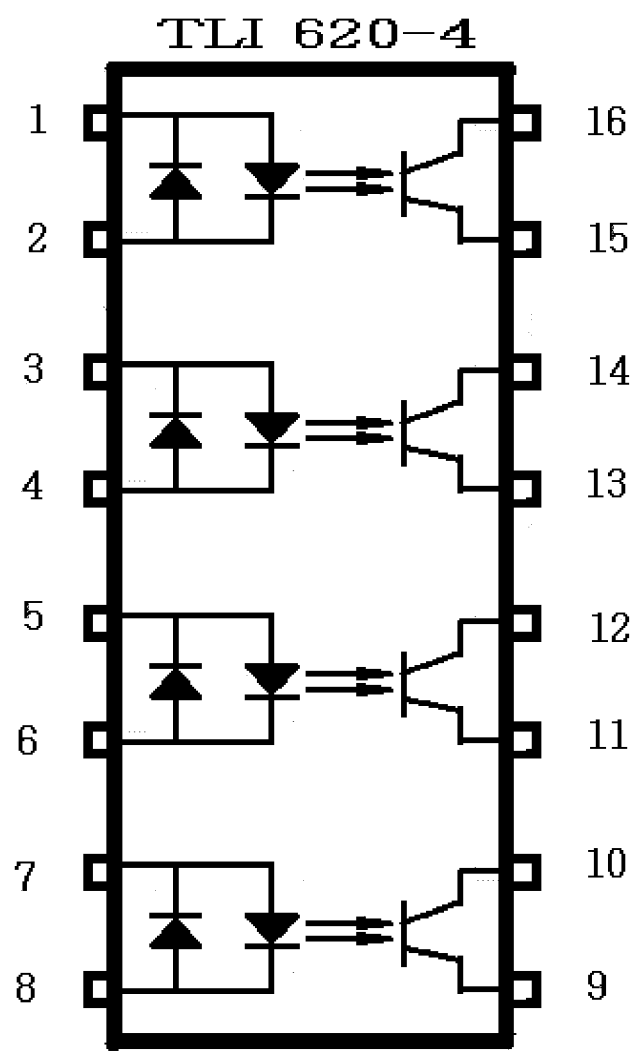
FIG. 4 is a circuit diagram of a photocoupler according to an embodiment of the present invention.

The power quality monitoring apparatus 2 for the railway power system further includes a TLP620-4 photocoupler which is used to isolate input and output signals. For example, the TLP620-4 photocoupler is used to input a DC100V level signal such as a P (11), B0 (27), B1 (28), B2 (29), or Door (145) signal. FIG. 4 is a circuit diagram of the TLP620-4 photocoupler.

The following tables show characteristics of the TLP620-4 photocoupler.

TABLE 4

| CHARACTERISTIC | SYMBOL | TEST CONDITION | MIN. | TYP. | MAX. | UNIT |
|---|---|---|---|---|---|---|
| ISOLATION CHARACTERISTICS (Ta = 25° C.) | | | | | | |
| Capacitance Input to Output | $C_S$ | $V_S = 0$, f = 1 MHz | — | 0.8 | — | $p^F$ |
| Isolation Resistance | $R_S$ | $V_S = 500$ V | $1 \times 10^{12}$ | $10^{14}$ | — | Ω |
| Isolation Voltage | $BV_S$ | AC, 1 minute | 5000 | — | — | $V_{rms}$ |
| | | AC, 1 second, in oil | — | 10000 | — | |
| | | DC, 1 minute, in oil | — | 10000 | — | $V_{dc}$ |
| SWITCHING CHARACTERISTICS (Ta = 25° C.) | | | | | | |
| Rise Time | $t_r$ | $V_{CC} = 10$ V | — | 2 | — | μs |
| Fall Time | $t_f$ | $I_C = 2$ mA | — | 3 | — | |
| Turn-on Time | $t_{on}$ | $R_L = 100$ Ω | — | 3 | — | |
| Turn-off Time | $t_{off}$ | | — | 3 | — | |

TABLE 4-continued

| CHARACTERISTIC | SYMBOL | TEST CONDITION | MIN. | TYP. | MAX. | UNIT |
|---|---|---|---|---|---|---|
| Turn-on Time | $t_{ON}$ | $R_L$ = 1.9 kΩ (FIG. 1) | — | 2 | — | μs |
| Storage Time | $t_s$ | $V_{CC}$ = 5 V, $I_F$ = ±16 mA | — | 15 | — | |
| Turn-off Time | $t_{OFF}$ | | — | 25 | — | |

Figure 5:
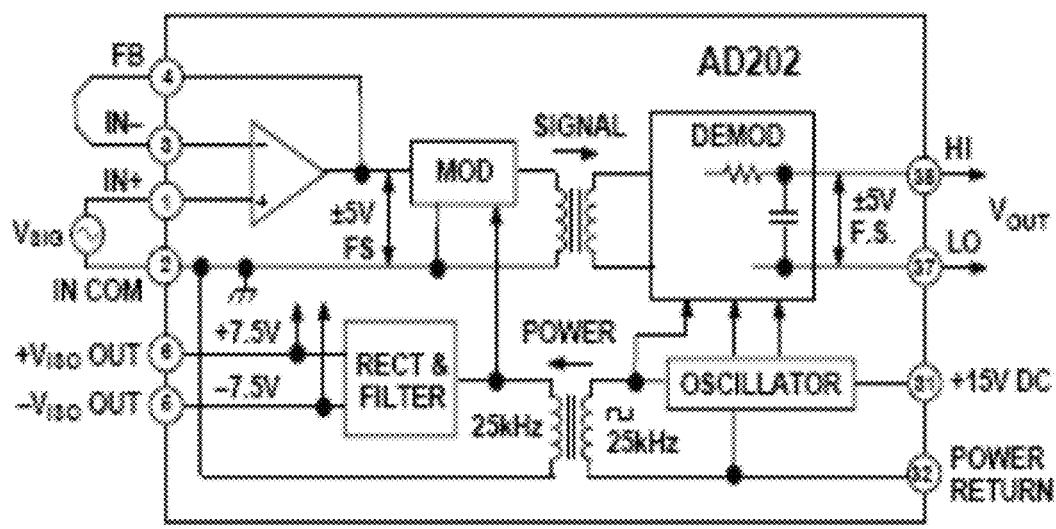
FIG. 5 is a circuit diagram of an isolation amplifier according to an embodiment of the present invention.

The power quality monitoring apparatus 2 for the railway power system further includes an AD202JY isolation amplifier which is used to isolate input and output signals including variable load and notch input signals to minimize the influence of the monitor apparatus upon the signals when interfacing with main elements used for control of a VVVF controller. FIG. 5 shows a circuit diagram of the AD202JY isolation amplifier. The following are characteristics of the AD202JY isolation amplifier.

Small Size: 4 Channels/Inch
High CMR: 130 dB (Gain=100 V/V)
Wide Bandwidth: 5 kHz Full-Power
High CMV Isolation: ±2000 V pk Continuous
Isolated Power Outputs The power quality monitoring apparatus 2 for the railway power system further includes a DS12c887 timer IC which is used to set a time to be stored in a recording device (CF card). Even when control power is turned off, the time of the DS12c887 timer IC continues to advance since a battery is included. The following are characteristics of the DS12c887 timer IC.

Totally nonvolatile with over 10 years of operation in the absence of power
Self-contained subsystem includes lithium, quartz, and support circuitry.
Counts seconds, minutes, hours, days, day of the week, date, month, and year with leap year compensation valid up to 2100
Binary or BCD representation of time and calendar
15 bytes of clock and control registers
113 bytes of general purpose RAM The voltage detectors 6 and 12 included in the power quality monitoring apparatus 2 for the railway power system use a voltage sensor (DCPT 2516). The following are characteristics of the voltage sensor (DCPT 2516).

Sensor Scale: 3000V/10V
Rated Voltage: 1800 Vdc
Polarity: Unipolar
Purpose: Voltage measurement of filter capacitor The voltage detectors 8 and 14 included in the power quality monitoring apparatus 2 for the railway power system use a current sensor (KLL3.0K-10VD). The following are characteristics of the current sensor (KLL3.0K-10VD).

Sensor Scale: 3000 A/10V
Polarity: Bipolar
Purpose: Current measurement of inverter and SIV Specifically, the converter 20 included in the power quality monitoring apparatus 2 for the railway power system is provided with a TMS320c32-60 DSP from Texas Instruments Co., Ltd., which is capable of real-time floating point calculations. The converter 20 includes a main controller, a DC power source that supplies control power, and an A/D board for analog input/output isolation.

Figure 6:
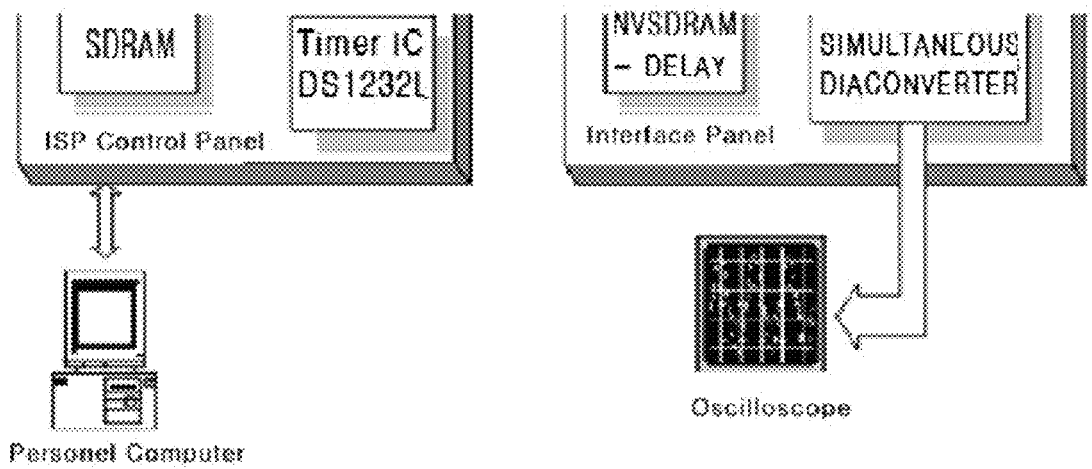
FIG. 6 is a block diagram of a monitor PCB according to an embodiment of the present invention.

FIG. 6 is a block diagram of the control board of the converter 20. For example, the converter 20 performs status data monitoring, data collection and recording, time setting through RS232C communication with a PC, and the like.

Figure 7:
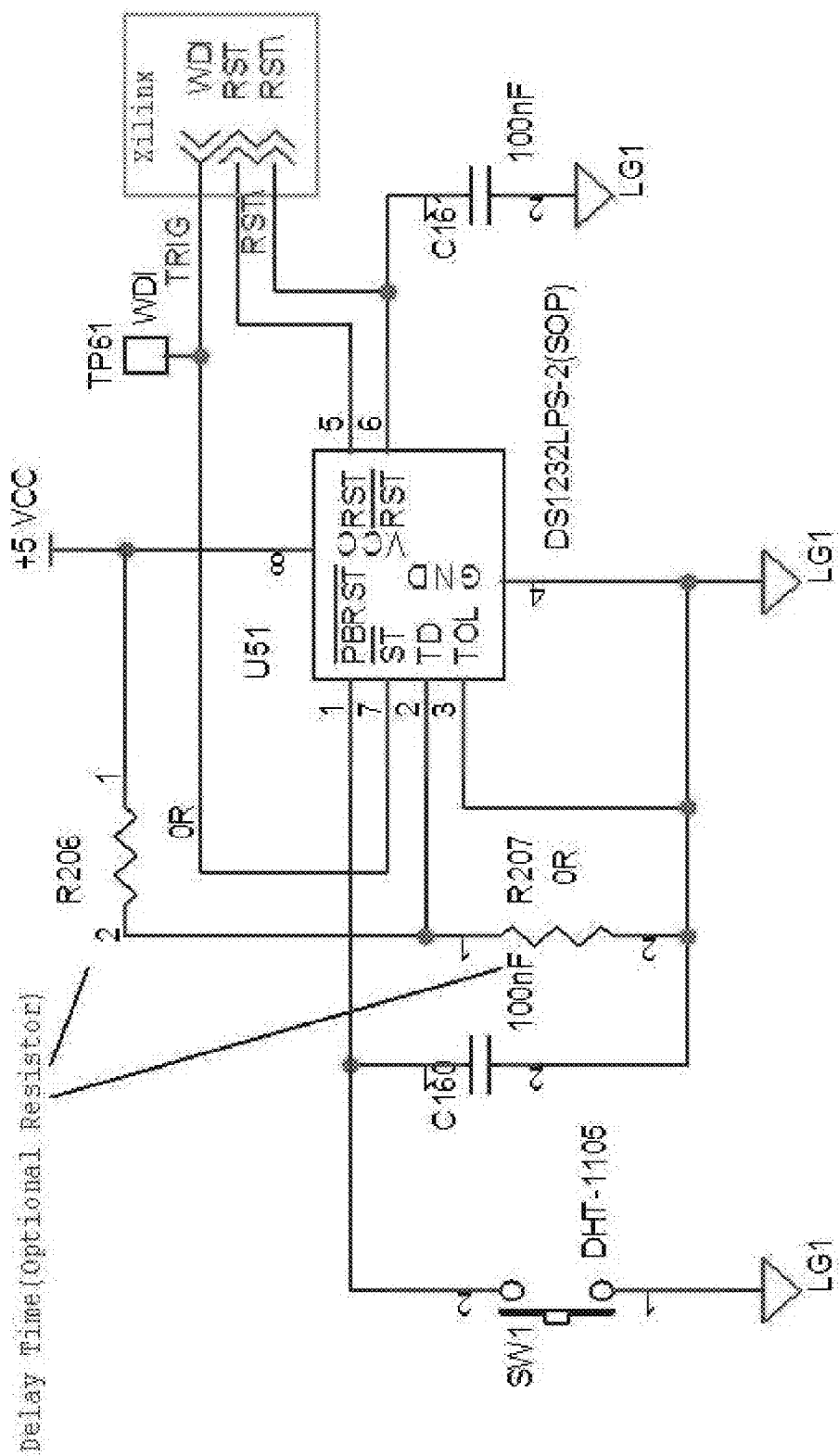
FIG. 7 is a circuit diagram of a power monitoring circuit according to an embodiment of the present invention.

More specifically, the converter 20 includes a TMS320C32 circuit and a power source monitoring circuit (reset circuit). FIG. 7 is a circuit diagram of the power source monitoring circuit.

The power source monitoring circuit of FIG. 7 is used to generate a reset signal for other circuits.

The power source monitoring circuit of FIG. 7 includes a DS1232 unit. The DS1232 unit outputs a reset signal when power is equal to or less than 4.5V when a 3rd pin (TOL) of the DS1232 unit has been connected to VCC and outputs a reset signal when power is equal to or less than 4.75V when the 3rd pin has been connected to GND, which corresponds to a power source monitoring operation.

The DS1232 unit also has a watch dog function to monitor whether or not a program of the CPU is properly running. To accomplish this, the watch dog function outputs a reset signal when no pulse is input to a 7th pin (ST) of the DS1232 unit. The watch dog function outputs a reset signal if no pulse is input for 1.2 seconds when a 2nd pin (TD) of the DS1232 unit has been connected to VCC, outputs a reset signal if no pulse is input for 150 msec when the 2nd pin (TD) has been connected to GND, and outputs a reset signal if no pulse is input for 500 msec when the 2nd pin (TD) has been opened. A 1st pin (PBRST) of the DS1232 unit is connected to a push button to allow manual reset.

Figure 8:
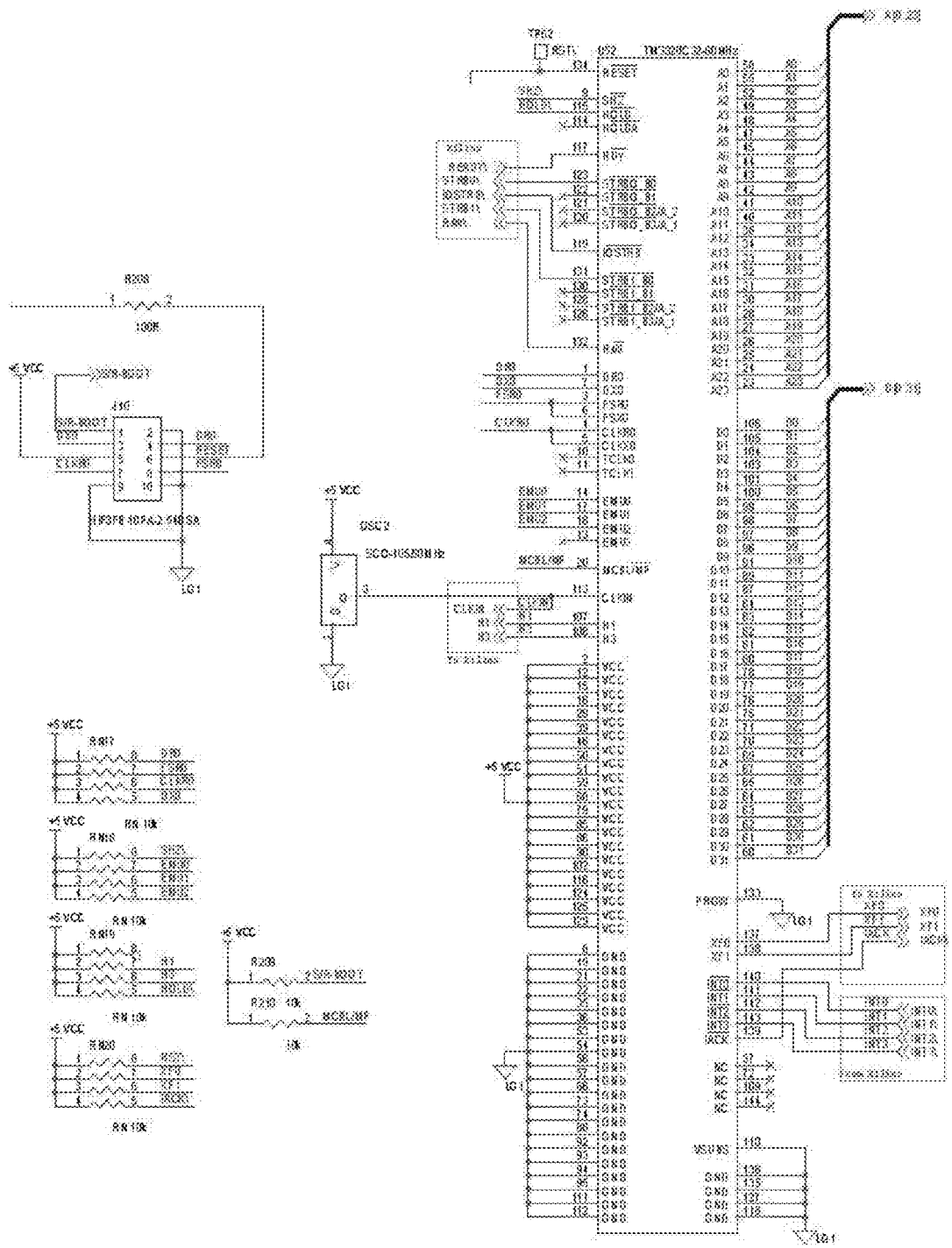
FIG. 8 is a circuit diagram of a main part of a CPU according to an embodiment of the present invention.

FIG. 8 is a circuit diagram of the CPU.

The following is a more detailed description of the DSP described above. The TMS320C32 circuit basically includes 24-bit address and 32-bit data buses. One serial port of the TMS320C32 circuit may be connected to a PC through a connector for program data downloading and program monitoring and a 32-bit and 2-channel timer thereof allows periodic data processing. DC 5V is used as a power source voltage of the DSP and a 60 MHz crystal oscillator is used as an operation clock of the DSP.

Figure 9:
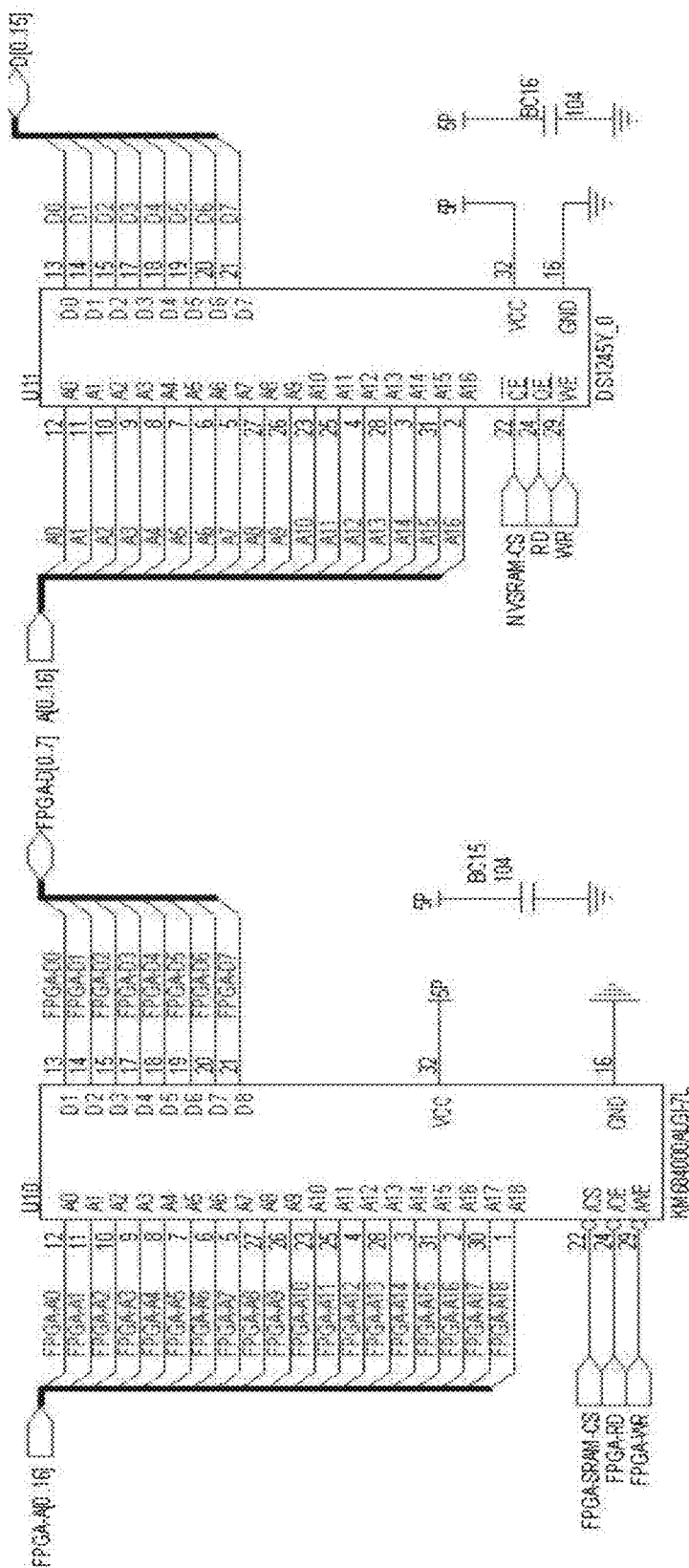
FIG. 9 is a circuit diagram of a main part of a memory according to an embodiment of the present invention.

The memory 22 basically needs to include a ROM and a RAM. Here, an 8-bit ROM and a 16-bit RAM are used for the memory 22. FIG. 9 is a circuit diagram of the memory.

A flash ROM which allows repetitive recording is basically used as the ROM of the memory and an SRAM for program operations/calculations and a Non-Volatile SRAM (NVSRAM) for storing malfunction data are used as RAMs of the memory.

Such memory chips include an address bus input portion and a data input portion. Each memory chip also includes pins (CS or CE pins) for receiving a chip selection signal to allow selection of the chip and input pins such as RD and WR pins. The chip selection signal is used to select each chip and is generated from logic circuits of an FPGA through address decoding.

Figure 10:
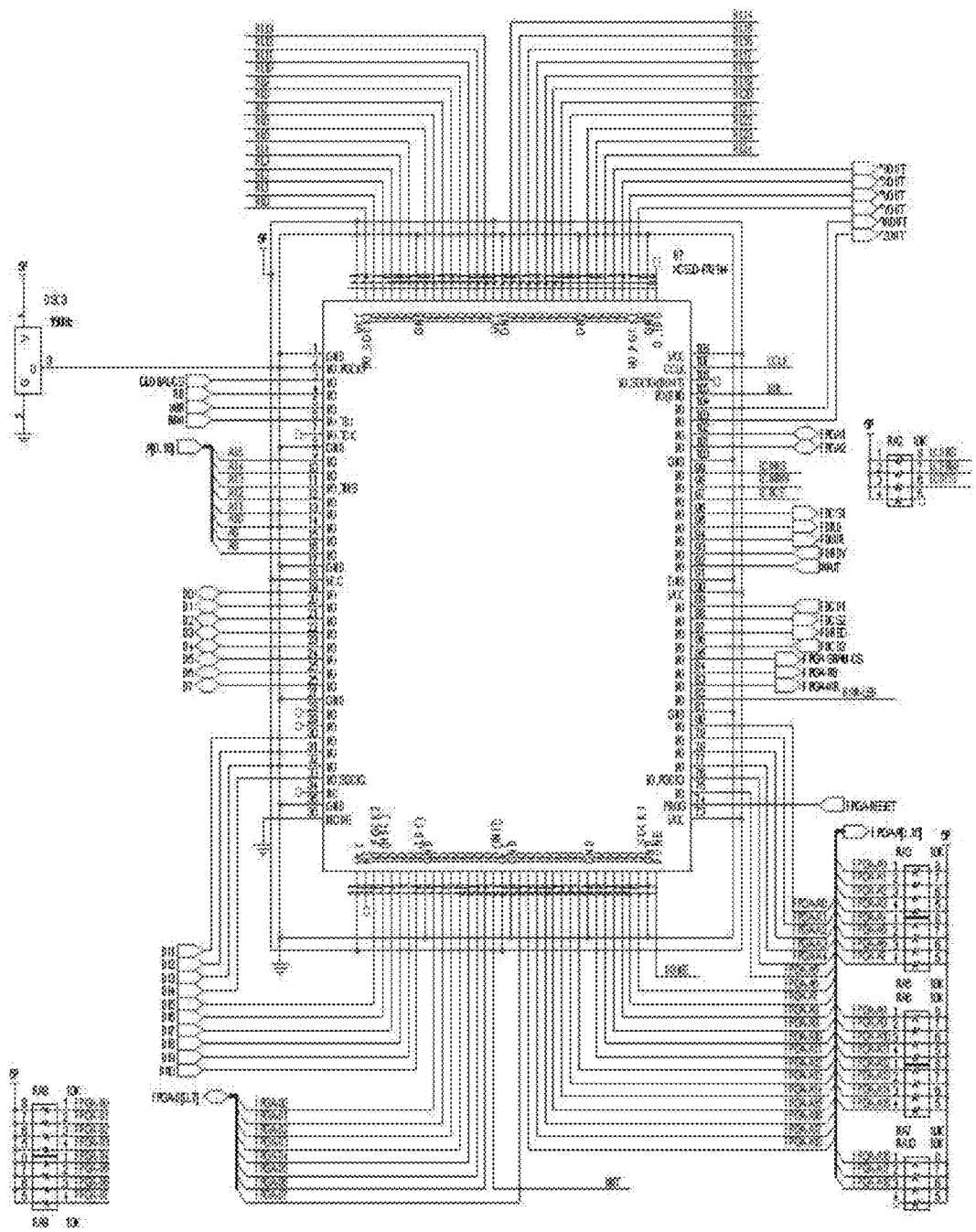
FIG. 10 is a circuit diagram of a main part of an FPGA according to an embodiment of the present invention.

FIG. 10 shows the FPGA which is programmable through logic circuits and which constitutes logic circuits for allowing the monitor PCB to control address decoding and digital input and output of each chip.

Since the FPGA performs address decoding, an address bus signal needs to be input to the FPGA. In addition, since the FPGA needs to perform sequence control or malfunction processing, a digital input and a digital output need to be connected to pins of the FPGA. Chip selection signals of the chips and a data bus of the CPU are also connected to the FPGA.

Figure 11:
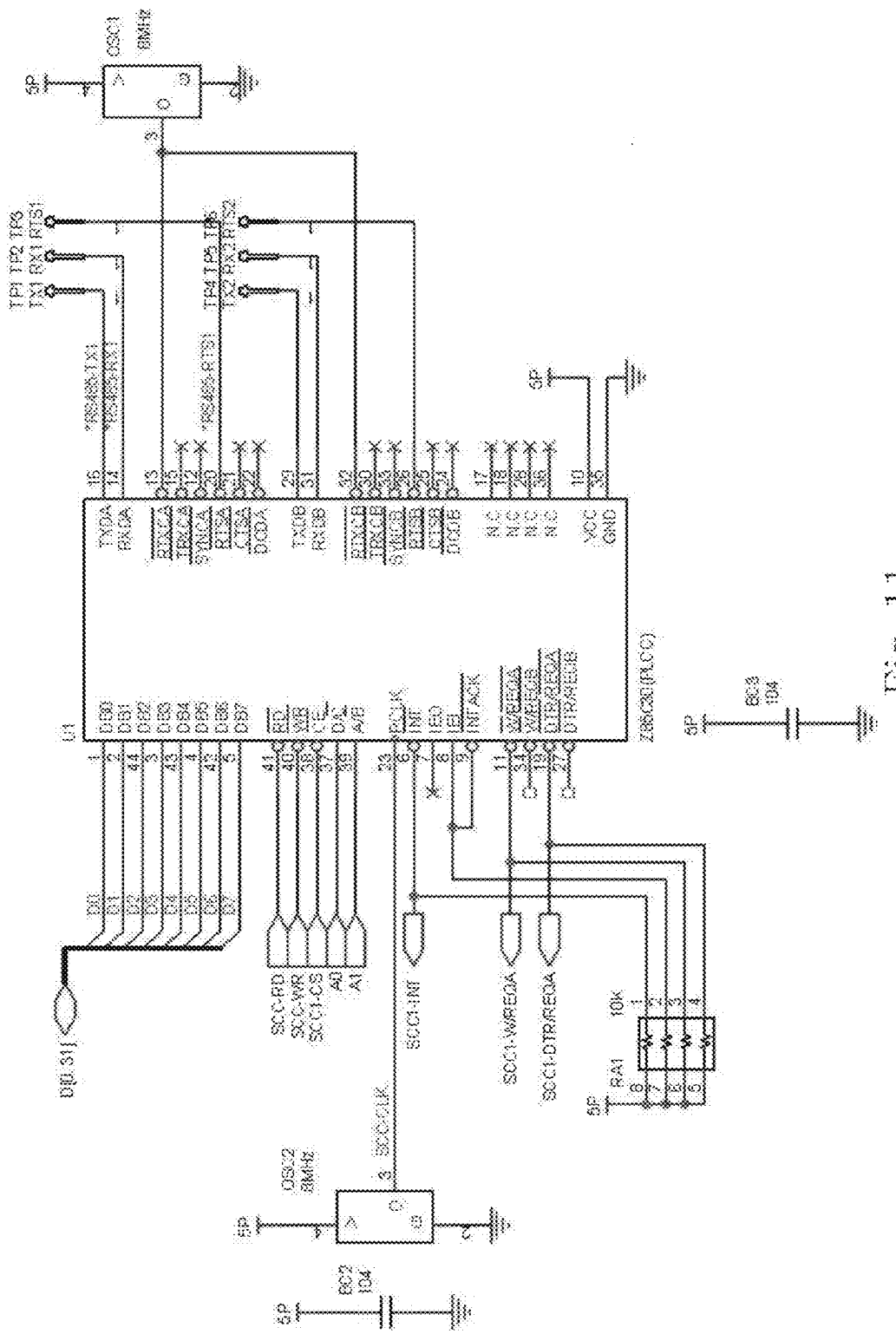
FIG. 11 is a circuit diagram of a serial communication controller according to an embodiment of the present invention.
Figure 12:
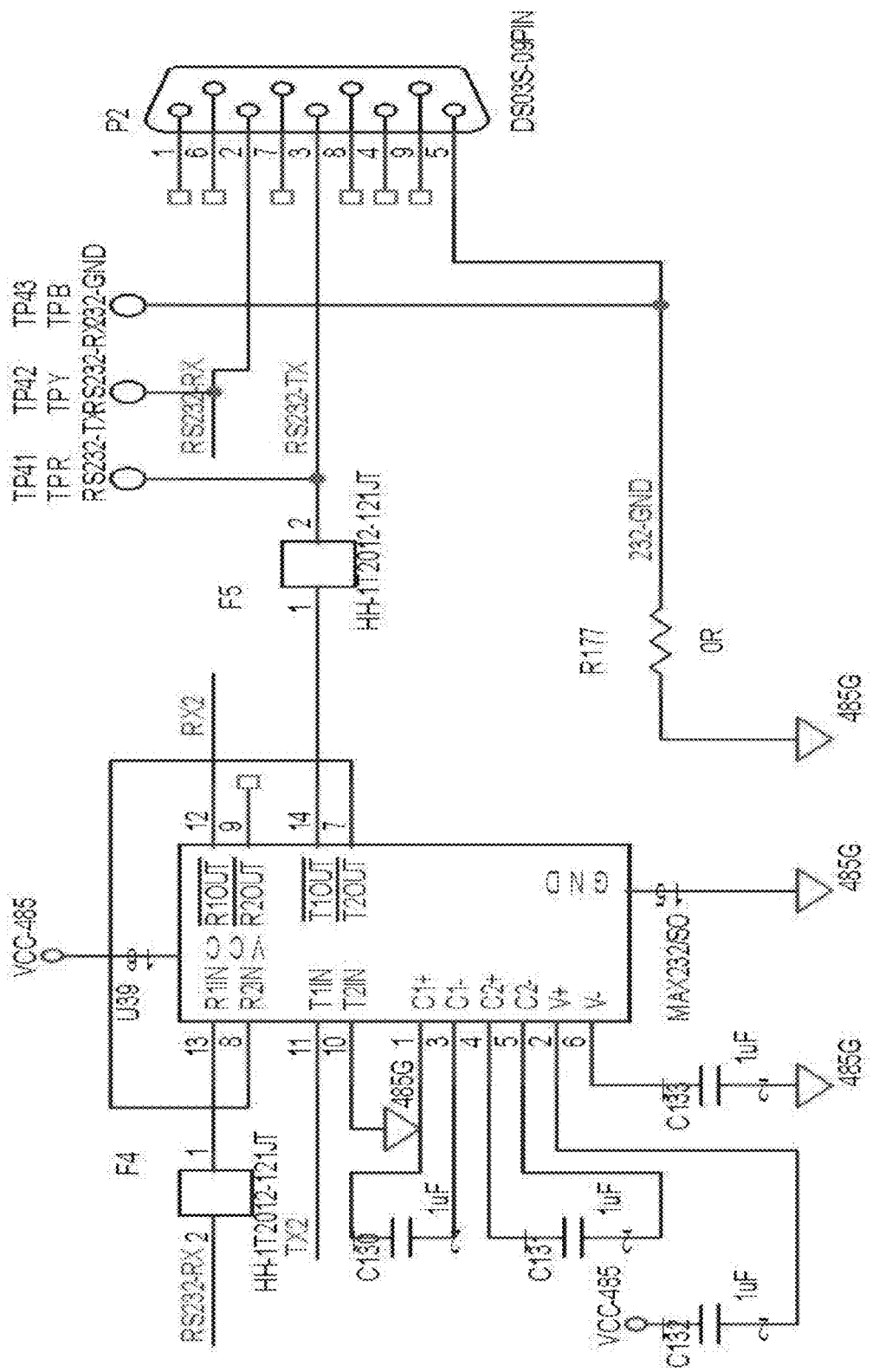
FIG. 12 is a circuit diagram of an RS232 driver according to an embodiment of the present invention.

The following is a description of the communication module 28. The communication module 28 is designed such that the main control board has two communication channels. One of the two channels is designed to exchange data with a PC through RS232 communication and a serial communication controller, which is referred to as "Z85C30" is used for the channel. FIGS. 11 and 12 are circuit diagrams of a Z85C30 circuit and an RS232 driver circuit.

Figure 13:
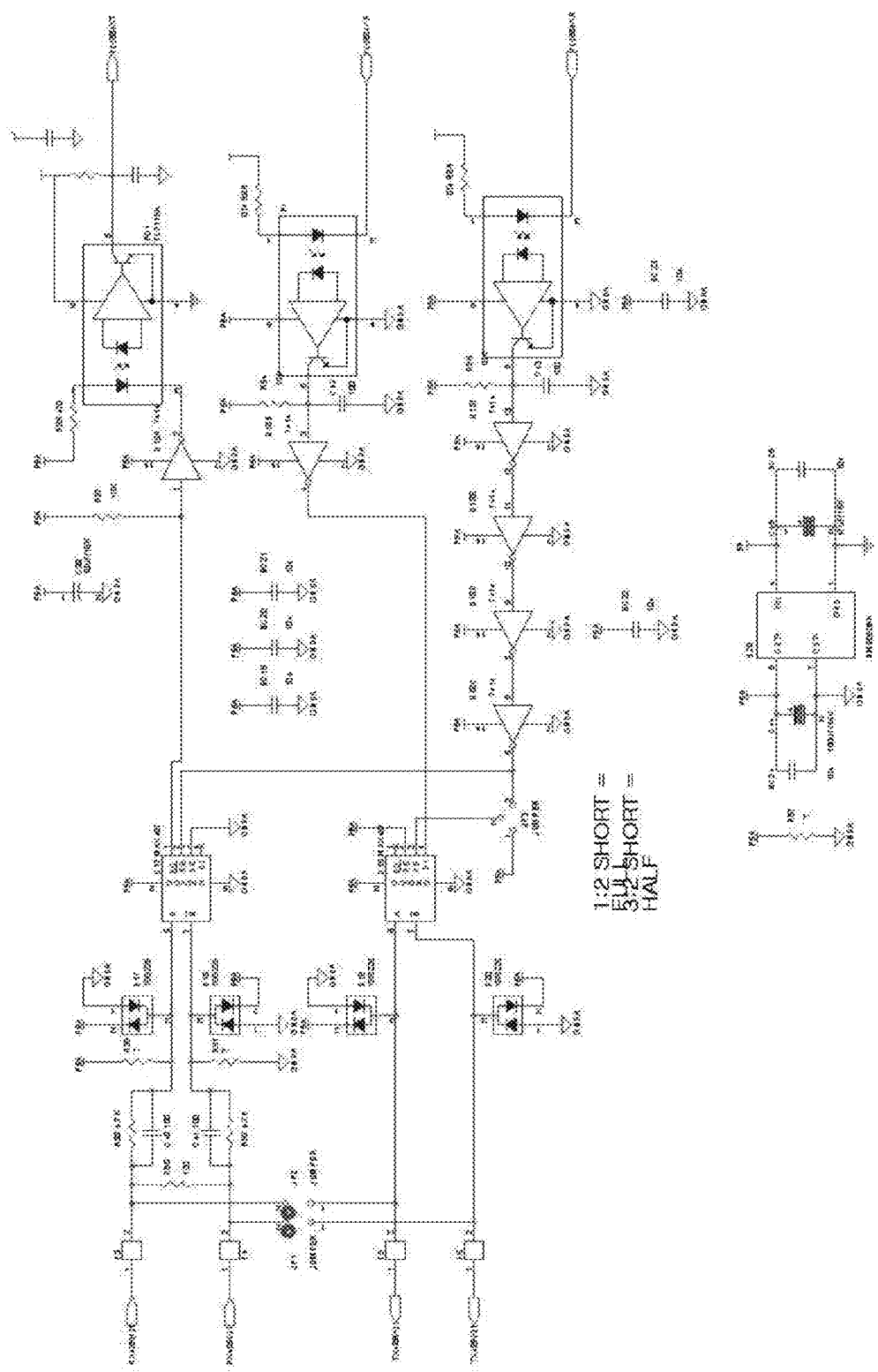
FIG. 13 is a circuit diagram of an RS485 communication circuit according to an embodiment of the present invention.

The other channel is designed to support additional RS485 communication. A communication port of a second channel of the Z85C30 is used as a communication port of the channel for RS485 communication. FIG. 13 shows a circuit for converting a Z85C30 signal into an RS485 signal.

The signal input unit 16 is used to input analog and digital signals and the main control board has current and voltage inputs as analog inputs. Since variable load and notch values are used for control signals, corresponding signals need to be electrically isolated from the main control board to guarantee stability (or reliability). Accordingly, there is a need to design and add an additional analog isolation board.

Figure 14:
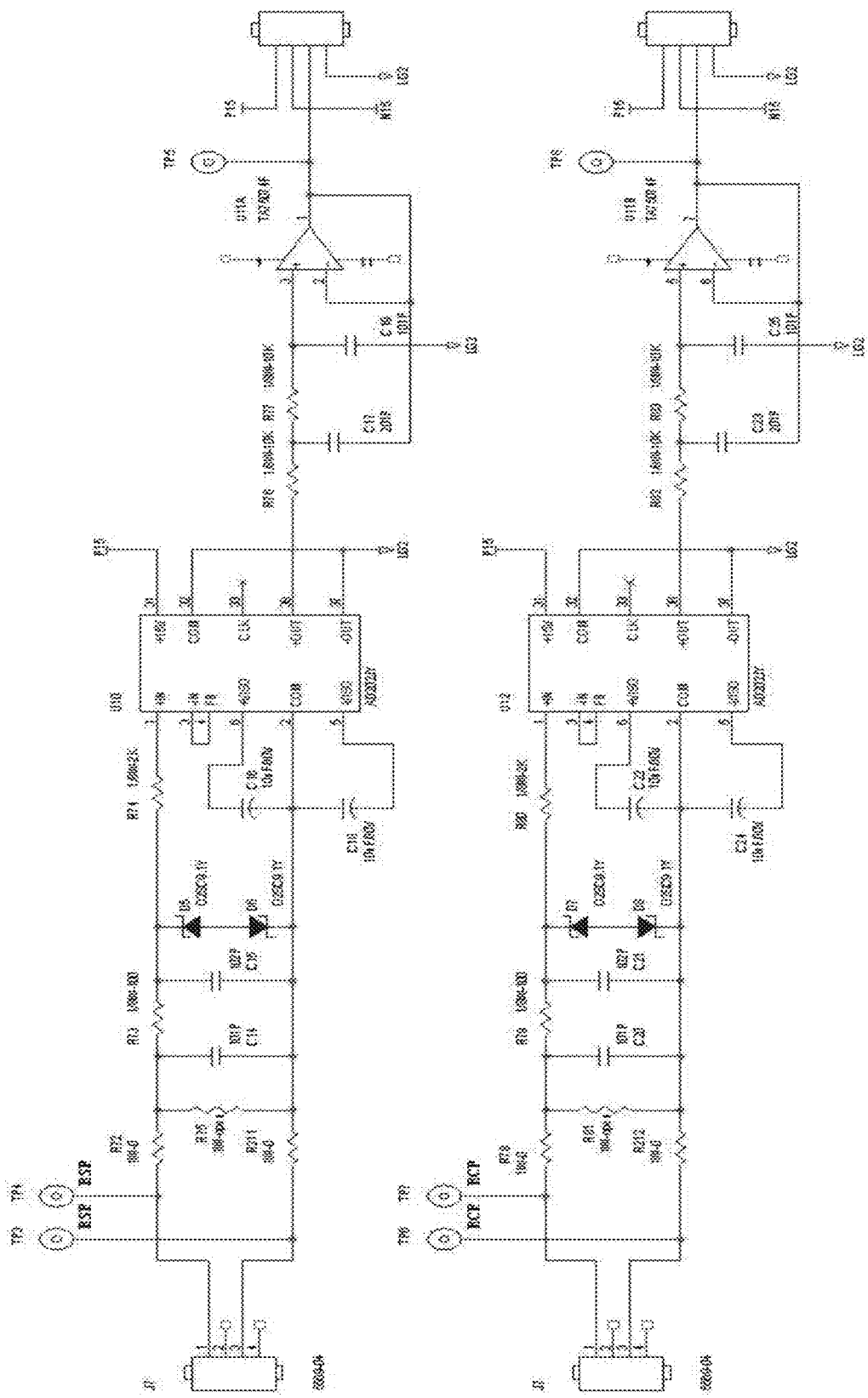
FIG. 14 is a circuit diagram of an analog isolation circuit according to an embodiment of the present invention.

FIG. 14 shows the analog isolation circuit. As shown in FIG. 14, an input voltage of this circuit is divided through a resistor and is then input to an input terminal of an AD202 unit, which is an isolation amplifier, via a filter. Here, the voltage division resistor needs to be highly precise and to have a capacity high enough to receive high voltage. A signal output from an output terminal of the AD202 unit is input to the CPU via a filter and a buffer.

Figure 15:
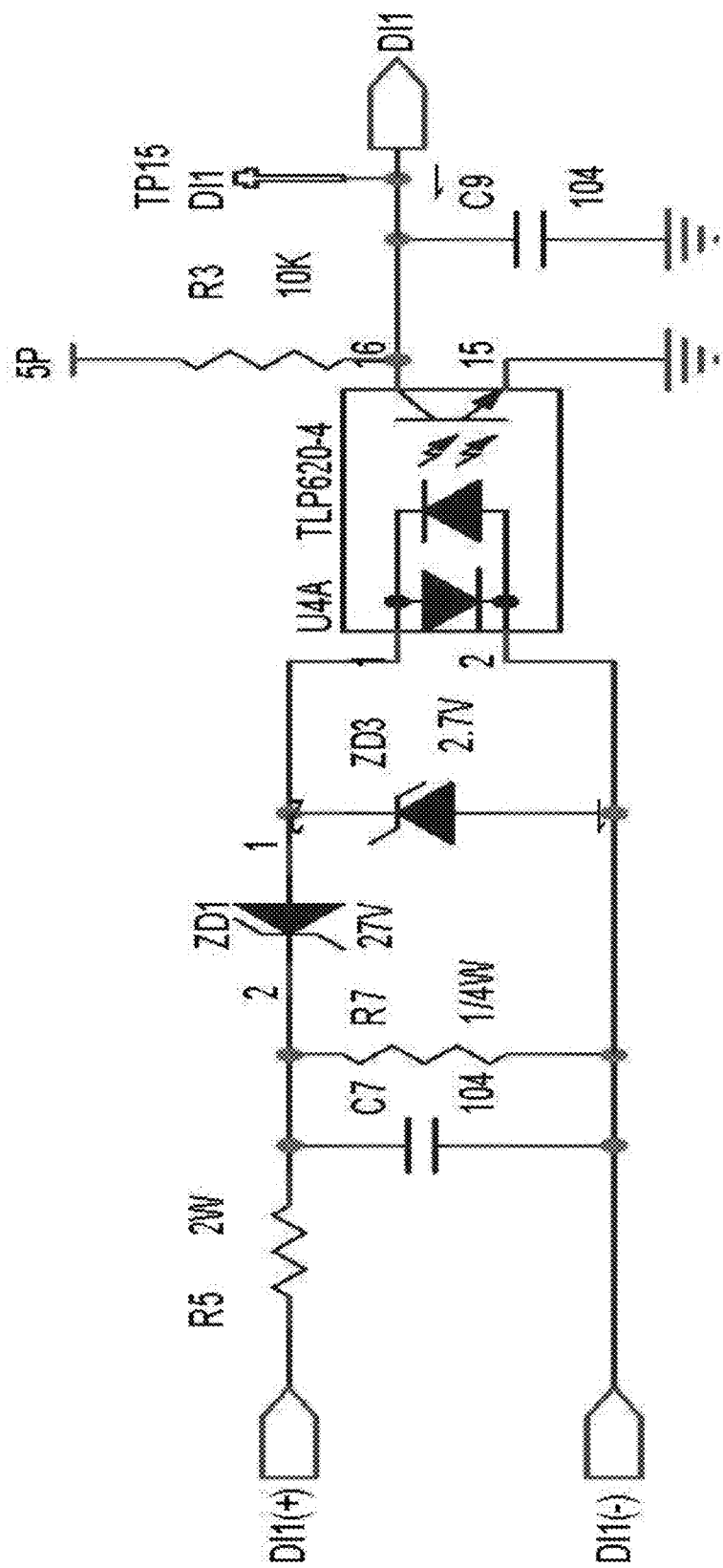
FIG. 15 is a circuit diagram of a digital input circuit according to an embodiment of the present invention.

In addition, as shown in FIG. 15, the main control board includes 12 digital input signal channels for receiving signals at a level of DC 100V through the photocoupler. Currently used channels of the 12 channels receive a powering signal (P), regenerative braking signals (B0, B1, B2), a notch input signal, and a door signal.

Figure 16:
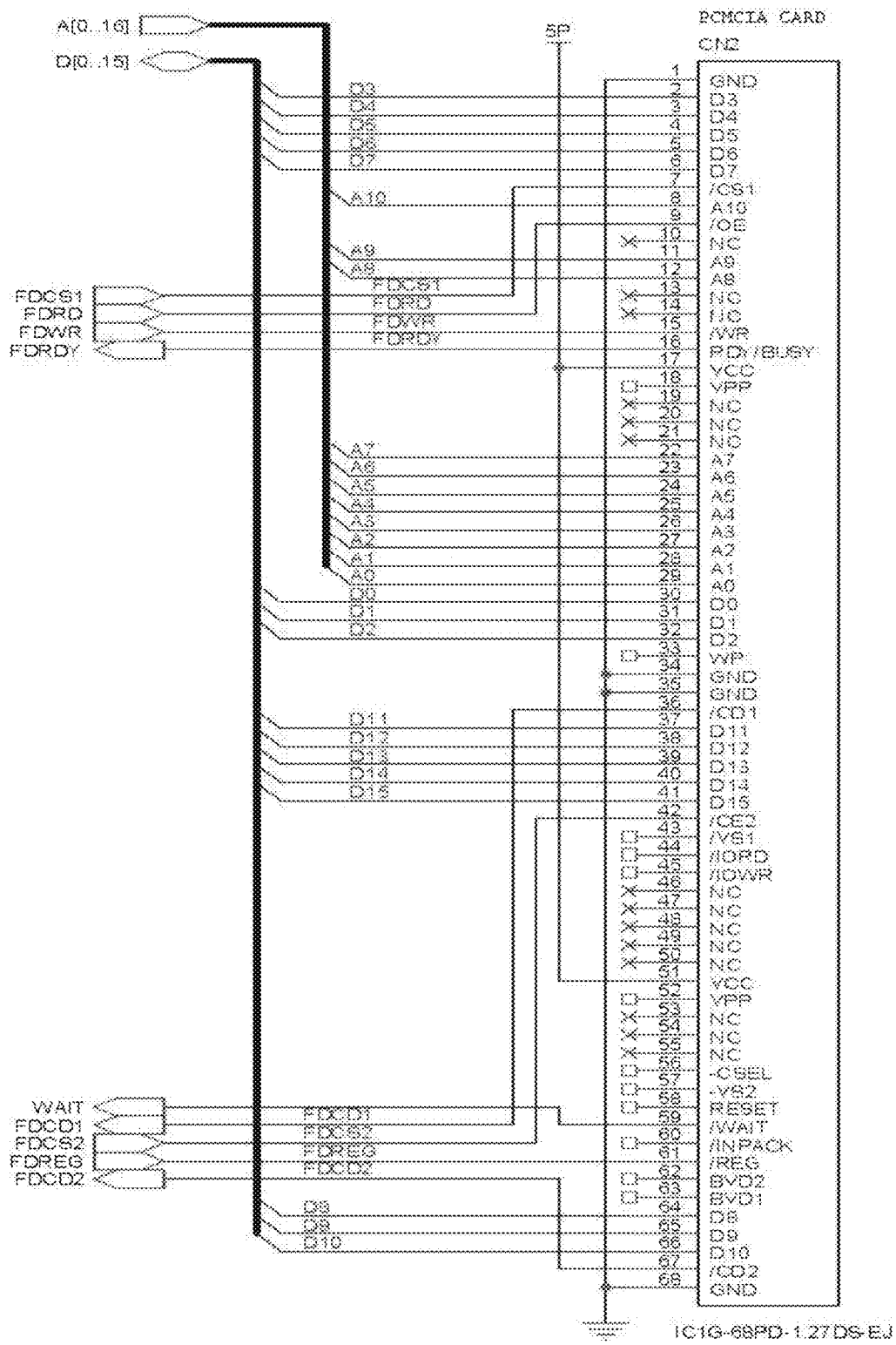
FIG. 16 is a circuit diagram of a PCMCIA card connector circuit according to an embodiment of the present invention.

The main control board included in the power quality monitoring apparatus 2 for the railway power system according to the present invention has a PCMCIA connector (see FIG. 16) for inserting a Compact Flash (CF) card, which is designed to store up to 2 gigabytes.

Since the pins are connected to address and data buses, a control pin for controlling the CF card interfaces with the DSP through the FPGA. The minimum recording unit of the CF card is 512 bytes per sector so as to simultaneously store 512 bytes. Analog and digital input values are first stored in a temporary memory and then, when the stored memory size reaches a memory size corresponding to the minimum recording unit, the values are recorded in the CF card.

Data recorded in the CF card is divided into a header, a body, and measured data that is calculated as a power value. 64×1,024 bytes are recorded as one block and the maximum number of blocks is 30,720 such that the total capacity is 2 gigabytes. When blocks are recorded, each block includes 1 header and 1820 bodies. Tables 5 and 6 show configurations of header and body memory maps.

TABLE 5

Header Memory Map

| Address | Content | Note |
| --- | --- | --- |
| 0 | Year | Year is recorded using BCD data |
| 1 | Month | Month is recorded using BCD data |
| 2 | Day | Day is recorded using BCD data |
| 3 | Hour | Hour is recorded using BCD data |
| 4 | Minute | Minute is recorded using BCD data |
| 5 | Second | Second is recorded using BCD data |
| 6 | Recorded Blocks | Up to 30,720 Blocks |
| 7 | | |
| 8 | | |
| 9 | | |
| 10 | Spare | Recorded as '0' |
| 11 | Spare | Recorded as '0' |
| 12 | Spare | Recorded as '0' |
| 13 | Spare | Recorded as '0' |
| 14 | Spare | Recorded as '0' |
| 15 | Spare | Recorded as '0' |

TABLE 6

Body Memory Map

| Address | Content | Note |
| --- | --- | --- |
| 16 + 0 × n | Overhead line voltage | Records overhead line voltage and has a code value as 12-bit data. |
| 16 + 1 × n | (reverse word) | |
| 16 + 2 × n | inverter input current | Records inverter input current and has a code value as 12-bit data. |
| 16 + 3 × n | (reverse word) | |
| 16 + 4 × n | SIV input current | Records inverter input current and has a code value as 12-bit data. |
| 16 + 5 × n | (reverse word) | |
| 16 + 6 × n | inverter output current | Records inverter output current and has a code value as 12-bit data. |
| 16 + 7 × n | (reverse word) | |
| 16 + 8 × n | converter input current | Records converter input current and has a code value as 12-bit data. |
| 16 + 9 × n | (reverse word) | |
| 16 + 10 × n | variable load | Records a variable load value and has a code value as 12-bit data. |
| 16 + 11 × n | (reverse word) | |
| 16 + 12 × n | Spare | |
| 16 + 13 × n | | |
| 16 + 14 × n | Spare | |
| 16 + 15 × n | | |
| 16 + 16 × n | Duty | Records a Notch value as a 100% value which is recorded as a value multiplied by 10 to express to one decimal place. |
| 16 + 17 × n | | |
| 16 + 18 × n | Digital Input | Records 12 digital input values. |
| 16 + 19 × n | | |
| 16 + 20 × n | Spare | |
| 16 + 21 × n | | |

TABLE 6-continued

Body Memory Map

| Address | Content | Note |
|---|---|---|
| 16 + 22 × n | Spare | |
| 16 + 23 × n | | |
| 16 + 24 × n | SIV power consumption | SIV power consumption is expressed as the product |
| 16 + 25 × n | (Wh) | of voltage and current and time and the accumulated |
| 16 + 26 × n | | value is recorded. |
| 16 + 27 × n | | |
| 16 + 28 × n | CI power consumption | CI power consumption is expressed as the product of |
| 16 + 29 × n | (Wh) | voltage and current and time and the accumulated |
| 16 + 30 × n | | value is recorded. |
| 16 + 31 × n | | |
| 16 + 32 × n | CI regenerated power | CI regenerated consumption is expressed as the |
| 16 + 33 × n | (Wh) | product of voltage and current and time and the |
| 16 + 34 × n | | accumulated value is recorded. |
| 16 + 35 × n | | |

Here, n is the number of blocks in a range of 0 to 30,719.

The time required to record one memory block is the time required to record a sampling period of 5 ms 1,820 times such that the required time is a total of 9.1 seconds. Accordingly, the time required to record the total memory size of 2 gigabytes is 279,552 seconds (=30,720 blocks×9.1 seconds) which is 77.65 hours. When the recorded time exceeds this time, data is again recorded in initial-state blocks, overwriting previous data.

As is apparent from the above description, the power quality monitoring apparatus for the railway power system according to the present invention has a variety of advantages. For example, it is possible to monitor changes in voltage and current values of trains, which are loads, and AC lines to output the changes in the voltage and current values, power consumption, and power flow in a graphical or text format, thereby making it possible to easily determine overall overhead line environments.

The power quality monitoring apparatus for the railway power system according to the present invention is not limited to the above embodiments and may be modified in various ways without departing from the spirit of the present invention.

What is claimed is:

1. A system comprising:
a voltage detector constructed to measure a DC overhead line voltage of a railway power system, the line voltage having a magnitude in excess of 1500 volts, the voltage detector located at a power supply unit of the railway power system;
a current detector constructed to detect current flow of up to hundreds of amperes to an overhead line from a regenerative braking system of a train at a voltage of 1800 volts, the current detector and located at a load unit of the railway power system;
a signal input unit constructed to receive signals from the voltage detector and the current detector;
a signal converter constructed to convert an analog signal received from the signal input unit to a digital signal;
a memory including a data storage unit constructed to store data received via the signal converter in real time;
a data record unit constructed to record collected data received via the signal converter;
a display unit constructed to display monitored data received from the signal converter; and
a controller constructed to:
receive voltage values detected via the voltage detector in real time;
receive current values detected by the current detector in real time;
monitor detected current and voltage values;
store power flow information and amounts of supplied power, the power flow information and amounts of supplied power determined from received voltage values and received current values; and
transmit railway power information to a remote location through a communication module.

2. The system of claim 1, wherein the controller comprises a calculating unit comprising a digital signal processor.

3. The system of claim 1, further comprising:
a photocoupler constructed to isolate input and output signals.

4. The system of claim 1, wherein the voltage detector is rated to at least 1500 Vdc, has a unipolar polarity, and is constructed to measure voltage of a filtered capacitor.

5. The system of claim 1, wherein the controller comprises a digital signal processor circuit constructed for arithmetic processing and a power source monitoring circuit.

6. The system of claim 1, wherein the controller outputs a reset signal when power is equal to or less than 4.5V when a 3rd pin of the controller has been connected to VCC and outputs a reset signal when power is equal to or less than 4.75V when the 3rd pin has been connected to GND.

7. The system of claim 1, wherein the controller has a watch dog function to monitor whether or not a CPU program is properly running by outputting a reset signal when no pulse is input to a seventh pin of the controller, and a watch dog function outputs a first reset signal if no pulse is input for 1.2 seconds when a second pin of the controller=has been connected to VCC, outputs a second reset signal if no pulse is input for 150 msec when a second pin has been connected to GND, and outputs a third reset signal if no pulse is input for 500 msec when the second pin has been opened.

8. The system of claim 1, wherein the system is constructed to detect a direction of current to calculate power consumption of DC power.

9. The system of claim 1, further comprising:
an isolation amplifier configured to isolate input and output signals, the input and output signals comprising variable load and notch input signals, the isolation amplifier constructed to interface with a variable voltage variable frequency controller.

10. The system of claim 1, wherein the system is constructed to output changes in voltage and current values, power consumption, and power flow of a railway power system in a graphical or text format.

* * * * *